United States Patent
Jain et al.

(10) Patent No.: US 6,515,257 B1
(45) Date of Patent: Feb. 4, 2003

(54) HIGH-SPEED MASKLESS VIA GENERATION SYSTEM

(75) Inventors: Kanti Jain, Hawthorne, NY (US); Nestor O. Farmiga, Rochester, NY (US)

(73) Assignee: Anvik Corporation, Hawthorne, NY (US)

( * ) Notice: Subject to any disclaimer, the term of this patent is extended or adjusted under 35 U.S.C. 154(b) by 156 days.

(21) Appl. No.: 09/818,013

(22) Filed: Mar. 26, 2001

(51) Int. Cl.$^7$ ................................................ B23K 26/06
(52) U.S. Cl. ................................ 219/121.73; 219/121.7
(58) Field of Search ........................ 219/121.7, 121.71, 219/121.73, 121.74, 121.75

(56) References Cited

U.S. PATENT DOCUMENTS

| | | | | |
|---|---|---|---|---|
| 4,744,615 A | * | 5/1988 | Fan et al. | 219/121.61 |
| 5,430,816 A | * | 7/1995 | Furuya et al. | 219/121.6 |
| 5,473,408 A | * | 12/1995 | Hoffman et al. | 355/53 |
| 5,517,000 A | * | 5/1996 | Nishiwaki et al. | 219/121.75 |
| 5,601,733 A | * | 2/1997 | Partlo | 219/121.7 |
| 5,624,437 A | * | 4/1997 | Freeman et al. | 606/10 |
| 5,835,647 A | * | 11/1998 | Fischer et al. | 385/31 |
| 6,037,564 A | * | 3/2000 | Tatah | 219/121.7 |

* cited by examiner

Primary Examiner—M. Alexandra Elve
Assistant Examiner—Len Tran
(74) Attorney, Agent, or Firm—Carl C. Kling (57) ABSTRACT

High-performance microelectronic modules, such as chip-scale packages, flip-chip modules, integrated micro-opto-electronic boards, fine-line printed circuits, and system-on-a-package modules, span a range of sizes and interconnect densities. Current technologies for via generation are not optimized for the varied cost considerations of different manufacturing requirements—direct-write tools address low-volume needs, whereas mask-projection systems are designed for very high via-density products. The system disclosed here will be highly cost-efficient for producing a wide range of modules. Its desirable features are high-speed via generation for different via densities, full via-pattern programmability, capability to drill high-threshold photo-ablation substrates, and full and efficient utilization of available high-power excimer lasers. A high-power laser beam is divided into multiple beamlets which are simultaneously directed to different via sites by a spatial light modulator array. Beamlets not needed for via generation are returned to the illumination system and recycled with the beamlets that reach via generation sites. A control system uses via site information and material characteristics to direct necessary numbers of laser pulses to selected via sites for optimum via generation efficiency.

28 Claims, 7 Drawing Sheets

HIGH-SPEED MASKLESS VIA GENERATION SYSTEM

CROSS-REFERENCE TO RELATED APPLICATIONS (NONE)

STATEMENT REGARDING FEDERALLY SPONSORED RESEARCH OR DEVELOPMENT (NONE)

REFERENCE TO A MICROFICHE APPENDIX (NONE)

BACKGROUND OF THE INVENTION (1) Field of the Invention

This invention relates to a high-speed laser-based via generation system for producing through-substrate and blind vias to make interconnects in high-density microelectronics systems. More particularly, this invention relates to an opto-mechanical system which delivers controlled pulses of laser energy to a large number of program-selectable via sites simultaneously at very high optical efficiency regardless of the number or density of vias. The system delivers the full energy of the laser among the vias being generated through the use of a high-speed opto-mechanical beam-steering system and a specialized energy recycling illumination system.

(2) Description of Related Art

Vias, the small diameter holes through one or more substrate layers, play an important role in electronic manufacturing because they provide the interconnections between layers in electronic modules. Electronic manufacturing has evolved to provide denser, faster, and more complex packaging technologies which rely heavily on a large number of micro-vias—vias with diameters less than about 150 μm—to provide the increasing number of required interconnections. The generation of these vias in electronic substrates has become a throughput-limiting and crucial step in the fabrication of advanced electronic modules. Via numbers and densities in these modules have increased to keep pace with the increasing complexity of electronic devices, but current via generation technologies cannot keep up with this growth and are fundamentally limited with respect to achievable throughput rates. This invention seeks to address this problem.

Depending on the application, the vias may need to be generated in regular, periodic patterns, such as in chip carriers, or in non-periodic patterns, such as on high density interconnect printed wiring boards. Often the vias need to be drilled through one or several substrate layers. Almost as often, the vias need to be generated such that they terminate or bottom out at a particular layer or depth—these are called blind vias. The vias need to be generated in a wide range of electronic substrate materials. These materials are most commonly dielectric polymers or glass-filled epoxies, but can also be more mechanically durable materials such as ceramics and metals. The wide range of substrate material properties poses a challenge for via generation systems.

Several technologies currently exist for via generation in electronic substrates: conventional mechanical drilling using metal or ceramic bits; lithographic patterning of the via pattern followed by chemical or plasma etching of the substrates; and direct laser photo-ablation. The mechanical technologies cannot produce micro-vias at high throughputs or with fine dimensions due to breakage of the bits and minimum diameter limitations. Lithographic and etching technologies are expensive, require multiple processing steps, are difficult to reconfigure, and are hard to control in depth for blind via applications. Optical technologies using laser photo-ablation show the most promise for rapid, clean production of micro-vias in a variety of substrates, but current systems are too slow to keep up with current production demands. This is mainly due to the serial nature of the via generation process and the power limitations of current frequency multiplied solid-state laser systems.

Laser via generation through photo-ablation provides many advantages: it allows a multitude of materials to be drilled without generation of harmful debris; it allows flexibility in via diameter, depth, and placement; and it typically does not require additional process steps. Photo-ablation is the process by which material is broken down to its smaller molecular or elemental components by being irradiated by a very high-fluence beam of ultraviolet radiation. For most materials photo-ablation is most efficient for radiation in the UV-region of the spectrum since most materials absorb energy very strongly at these wavelengths. For each material and laser wavelength there is a photo-ablation threshold fluence above which ablation occurs efficiently, and there is a photo-etch rate that characterizes the rate at which the material is ablated away. For most dielectric materials used in electronics manufacturing the ablation threshold fluence can range from about 100 mJ/cm$^2$ to several Joules/cm$^2$ at wavelengths near 300 nm, and etch-rates for 1 J/cm$^2$ fluences at these wavelengths are typically 0.5 μm/pulse. For this reason, powerful UV lasers are required to generate vias efficiently. Currently, only excimer lasers such as XeCl and certain frequency-multiplied solid-state lasers such as Nd:YAG can deliver the required fluences. Excimer lasers are attractive because they are the most powerful of these, whereas frequency-multiplied solid-state lasers are used due to their high repetition rates and focusability.

Systems which use solid-state laser sources typically focus the low average power, frequency-multiplied beam into a very small spot—typically about 20 μm in diameter—to achieve the high fluences required for photo-ablation. They generate the required via patterns by a combination of galvo-mirror beam deflection to move the spot on the substrate and automated planar (X-Y) stage motion to present different areas of the substrate to the beam. The throughput of these systems depends on how quickly the focused laser spot can be moved from one via site to the next, by the dwell time required at via site, and by the average power of the laser source. Although this process can be easily programmed and is, thus, very flexible, it is essentially a serial process, and therefore, has an inherently low throughput. In addition, via diameters are limited to a minimum size of about 20 μm.

Systems using scanning mask projection and high-power excimer lasers for massively parallel via generation have been described in Jain, U.S. Pat. No. 5,285,236. Such systems capitalize on the much greater powers delivered by excimer lasers to generate the required fluences over large areas of the substrate. In these systems a large-area, uniform beam is produced by a specialized illumination system, as described in Jain, U.S. Pat. No. 5,059,013, and Farmiga, U.S. Pat. No. 5,828,505. This beam illuminates a via pattern on a mask which is projected onto the substrate by a projection imaging system. In such a system, all the vias in the illuminated region are generated simultaneously, the throughput being limited only by the etch-rate of the material and not the number of vias. For very dense via density applications, this type of system can achieve extremely high throughputs, especially when the illumination system incorporates energy recycling as described in Hoffman and Jain, U.S. Pat. No. 5,473,408. For low via densities, however, such a large-area projection system can be slow and inefficient. In addition, such a system is not very flexible in that it requires expensive masks to be generated for each required via pattern.

Current electronic manufacturing demands via generation systems with the programmability of the serial solid-state laser-based systems and the high throughputs of the massively parallel excimer laser-based systems. Highly desirable features are high-speed via generation; full via pattern programmability—including via diameter, position, and depth; capability to drill high-threshold photo-ablation substrates; and full and efficient utilization of available laser energy. The invention described below provides all these features. It makes full and efficient use of the power available from excimer lasers and provides full programmability of the via pattern.

BRIEF SUMMARY OF THE INVENTION

This invention is a via generation system which produces vias in a variety of microelectronic substrate materials by the process of laser photo-ablation. This system optimally utilizes the full energy available from the laser source by efficiently dividing and channeling the radiation into a number of beams which is exactly the same as the number of vias to be generated in a given module region. The system ablates all vias in a particular module region simultaneously and allows excess energy (i.e., the unused beam energy due to absence of a via at a location) to be 'recycled' to speed the process and make it more efficient. A computer control system allows each via location, size, and depth to be fully programmed and automatically generated. The various subsystems, objects, features, and advantages of this via generation systems are described in more detail below.

An excimer laser, such as a high-power xenon chloride laser operating at 308 nm, serves as the radiation source for the system. The output beam from this laser is shaped and uniformized by the illumination subsystem, a system of optics including standard lens elements and a 'homogenizer' unit. The homogenizer unit includes a special mirror at its input end that allows reflected radiation from further down the optical train to be returned into the train for more efficient utilization, in effect recycling the reflected energy. The output of the illumination subsystem is an approximately collimated beam with excellent intensity uniformity and the proper cross-sectional shape, typically hexagonal to allow for densest packing of via-generating beamlet grid as will be described below. The output beam is sized to obtain a high enough fluence at the substrate for photo-ablation; larger beams allow higher throughputs, but the fluence drops as the area is increased.

The shaped, uniformized, and collimated laser beam enters the beamlet steering subsystem which directs the radiation to the proper via sites. The beamlet steering subsystem is a high-speed opto-mechanical system that divides the incident beam into many beamlets and allows computer-controlled steering of each individual beamlet produced to a selected via site.

In the first embodiment of the invention, the nearly collimated input beam from the illumination subsystem is divided into an array of beamlets by a two-dimensional array of micro-lenses known as a fly's-eye lens array. Each lenslet in the array focuses a small fraction of the incident beam onto a single, corresponding, tip-tilt mirror element in a computer-controlled two-dimensional tip-tilt mirror array. The mirror elements in this array are actuated by high-speed actuators such as piezo-ceramic pistons working in groups to accomplish the required tip-tilt motion. The computer control specifies the tip and tilt angles of each mirror element, and, thus, the direction in which each beamlet will be reflected. In this way, computer-controlled simultaneous steering of a large number of beamlets is realized. The beamlets are directed by the steering mirror array into a large array of optical fibers which channel the radiation to the substrate either directly (close proximity) or by a projection lens (which allows a large working distance). Each steering mirror element can direct its beamlet into one of several fibers within its steering range. Typically one mirror element can address any one out of seven fibers packed in a dense, hexagonal array. Beamlets which are not required for ablation (if the number of vias being patterned is less than the maximum), can be reflected back into the energy-recycling illumination subsystem which reuses the available radiation. The optical fiber array covers a certain region of the substrate and each fiber can deliver radiation for photo-ablation of the substrate at one location in this region. Thus, radiation is directed to any of a large number of sites on the substrate for via generation. Via target sites which do not fall on the grid formed by the fiber array are accessed by moving the substrate and/or beam-steering system with a precision X-Y stage. The final result is that a large number of beamlets can be efficiently directed to many different via locations on the substrate simultaneously to generate the required via pattern.

In the second embodiment of the invention, a lens system placed after the homogenizer images the input face of the homogenizer to produce a focal spot array which then impinges on a two-dimensional mirror array similar to that described above. This focal spot array (FSA) is formed because the point source of radiation entering the homogenizer undergoes a multitude of reflections within the internally mirrored homogenizer unit and, when imaged, appears as a multitude of point sources corresponding to the number and angle of the reflections produced within the homogenizer unit. The homogenizer and FSA lens are designed to produce the grid of focal spots required. The intensity of the various focal spots in the FSA can be equalized by the use of an apodization filter if required. Each spot in the FSA impinges on a single steering mirror element and is reflected into a projection lens which refocuses the radiation tightly onto the substrate. By controlling the tip and tilt of the mirror elements, each spot can be positioned anywhere in the image field of the projection lens to generate the required via patterns. Multiple beamlets from different mirror elements can be directed to the same via site to speed the ablation process, or unneeded beamlets can be reflected back into the illumination system for energy recycling.

In either embodiment, the computer control system is a critical component as it controls the beam-steering mirror array to position the beamlets at the correct via locations on the substrate and coordinates the other subsystems to generate the vias correctly. The control system reads information on the via patterns from standard CAD files—this information includes via locations, sizes, and depths—and coordinates the firing of the laser, the motion of the X-Y stages, and, most importantly, the tip-tilt beamlet steering mirror arrays to generate the correct via patterns on the substrate. Because all aspects of the beamlet delivery can be controlled, optimized patterning algorithms can be generated to maximize the efficiency of the via generation process.

For each module being covered on the substrate at a given moment the number and location of beamlets needed to address the via sites selected for via formation will be known in advance from the CAD file. The total laser energy required for full ablation, which can be expressed as the number of laser pulses required to drill through the substrate, depends on the number of selected via sites in the module. Since a portion of the incident laser radiation is recycled when the number of vias is less than the maximum, fewer pulses are required to drill this smaller number of via sites. The varying energy requirement from module to module is managed by the control system to ensure that the correct number of laser pulses, and hence energy, is delivered to each site regardless of how many via sites the module contains. This allows a highly efficient use of the available laser power without sacrificing the benefits of massively parallel via generation.

The object of the invention is to provide an efficient system for laser formation of vias in microelectronics substrates over a very wide range of via densities.

A more specific object of the invention is to provide a computer-controllable pattern of high-fluence, shaped, spatially homogenized, pulse-repetition-controlled, and directed laser beamlets at the selected sites of the substrate to form by photo-ablation the desired via pattern in minimal time with optimal efficiency.

A feature of the invention is energy recycling together with computerized control of the number of laser pulses as required for the number of vias patterned in a given module region. In this way, all the vias in a given module region are generated simultaneously with optimal energy utilization, greatly increasing throughput over serial via generation systems and also over mask-projection via generation systems tasked with patterning modules of varying via densities.

A feature of the invention is the pairing of a fly's-eye micro-lens array with a computer-controlled tip-tilt micro-mirror array to steer an array of beamlets into grouped optical fibers. Each pair of a fly's-eye micro-lens and a micro-mirror can deliver a beamlet to one fiber in an optical fiber group which is part of a larger fiber array, e.g., to one of seven optical fibers grouped six-around-one in a tight hexagonal grouping. Each fiber thus addressed channels the radiation to a unique via location on the substrate allowing a via to be generated there by photo-ablation.

Another feature of the invention is the pairing of a focal spot array generating optical system with a computer controllable tip-tilt micro-mirror array to position beamlets through a projection lens onto selected via sites on the substrate, thereby generating the desired via pattern by photo-ablation.

Another feature of the invention is computer control of the number of laser pulses applied to a selected substrate module region as a combined function of number of vias to be drilled and calculated energy recycling.

Still another feature of the invention is selective fine positioning of the vias within the substrate module by computer controlled displacement, jittering, overlapping, rotating, or other motion of the substrate stage or beamlet steering optics as required to allow for via generation at any set of points on the substrate. This allows vias to be generated with a closer spacing than would be possible with mask-based systems.

An advantage of the invention is that the via generating process can be optimized for each module region of the substrate (for high throughput) by full control of the applied irradiation. The control computer can calculate the optimal number of pulses, beamlet positions, and X-Y translation schedule based on the desired via pattern and the energy recycling factor.

Another advantage of the invention is the ability to use recycled radiation energy to increase the rate of generation of vias in low- to medium-density patterns.

Another advantage of the invention is that the same system may be efficiently used for generating via patterns over a large range of via densities range on the same substrate.

Other objects, features and advantages of the invention will be apparent from the following written description, claims, abstract, and the annexed drawings.

DETAILED DESCRIPTION OF THE INVENTION

This invention is a high-resolution, high-speed programmable via generation system which produces vias in a variety of microelectronic substrate materials by the process of laser photo-ablation. This via generation system efficiently divides the full available energy from the laser source among multiple via generating beamlets. The highly efficient illumination system allows the energy in unused beamlets to be 'recycled' into the system. Two preferred embodiments of the invention are described. In the first embodiment, the beamlets are formed by a fly's-eye lens array and directed by a micro-mirror array to a fiber bundle which channels the radiation to the substrate. In the second embodiment of the invention, the beamlets are formed from a focal spot array (FSA) and directed by a similar micro-mirror array through a projection lens onto the substrate.

Figure 1:
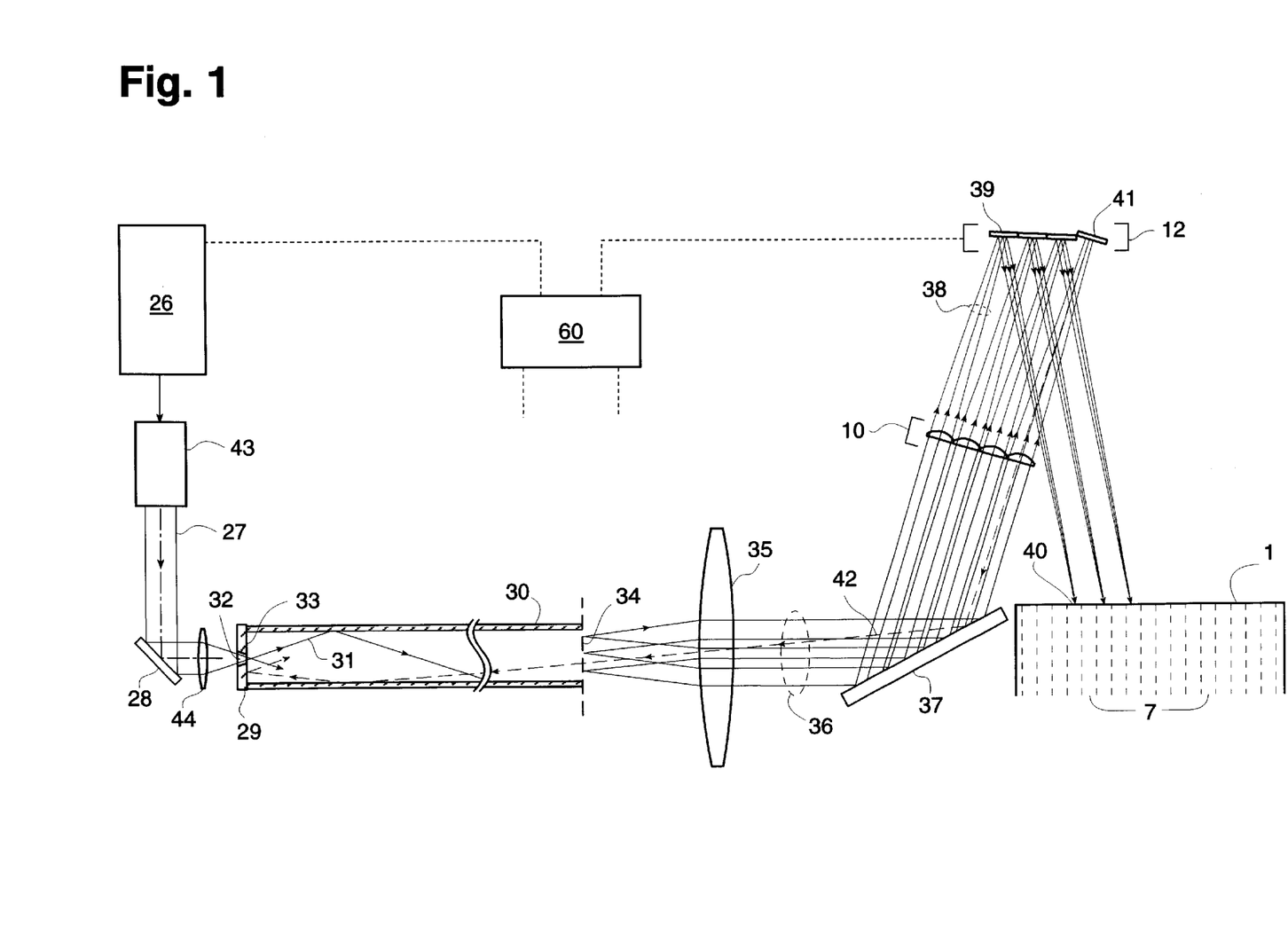
FIG. 1 is a schematic view of the illumination, beamlet generation, and beamlet steering optical systems, including the energy-recycling homogenizer, fly's-eye lens array and tip-tilt micro-mirror array. The figure depicts the precise delivery of three beamlets to the predetermined optical fibers in the optical fiber bundle, and the reflection of one unused beamlet back to the homogenizer for energy recycling.

FIG. 1 presents a schematic layout of the first embodiment of the invention and shows the optical path through the system. Radiation originates from the excimer laser source 26 and is fed into the beam-conditioning optics 43 which roughly shape and collimate the beam. The roughly collimated beam 27 is steered by a fold mirror 28 and then focused by a focusing lens 44 into the energy-recycling homogenizer 30 which makes the beam's intensity uniform and gives it the proper cross-sectional shape in the exit plane 34. A condenser lens 35 then collimates the output beam 36. A steering mirror 37 directs this beam into a 2-D fly's-eye microlens array 10 which breaks up the collimated beam 36 into an array of converging beamlets such as 38. Each of these beamlets, e.g. 38, impinges on a single mirror element, e.g., 39, of a tip-tilt micro-mirror array 12. Each mirror element, e.g. 39 or 41, of the array 12 can be tipped and tilted by a computer-controlled servo system. Each mirror element, such as 41, also can be tilted enough to retroreflect the beamlet incident upon it to enable the unused beamlet to be directed back into the homogenizer 30 so its energy can be 'recycled' into the system. Each mirror element, e.g. 39, can steer the beamlet incident upon it, e.g. 38, into one of several fibers, e.g. 40, in a fiber bundle 1. The individual fibers, e.g. 40, of the fiber bundle 1 are arranged in a grid pattern such as the one illustrated in FIG. 2. Each fiber is positioned over a potential via site 4. The fibers channel the beamlets down to the substrate 2 (mounted on a substrate stage 58) where the radiation in the beamlets forms the vias by the process of photo-ablation. The radiation may either propagate from the fiber across a small gap to the substrate 2 or be imaged by a projection lens (not shown) between the fiber bundle 1 and the substrate 2. The various subsystems of this first embodiment will be described in more detail below.

Figure 6:
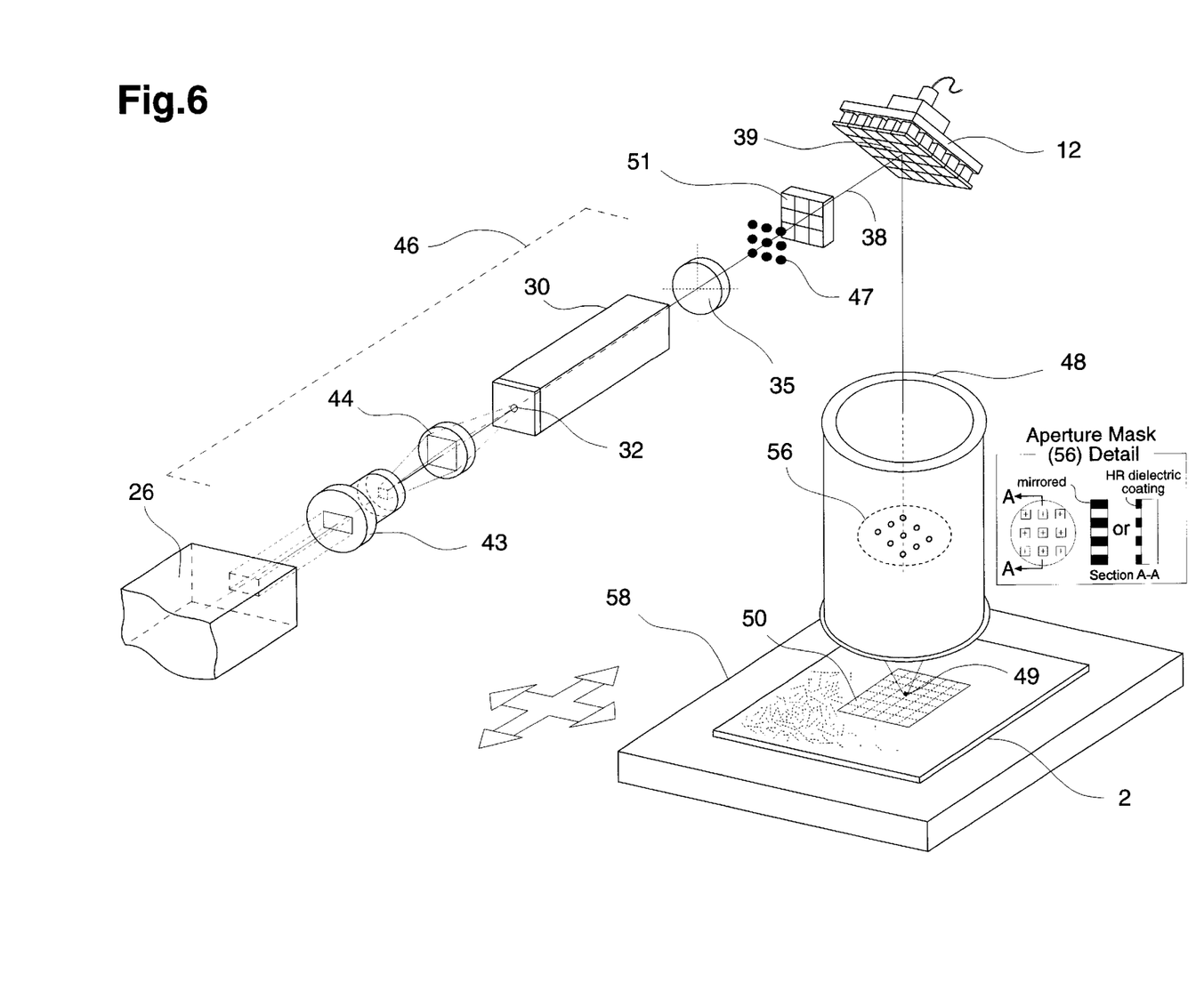
FIG. 6 shows a schematic representation of the system using a focal spot array generator and projection lens to form and steer the individual beamlets.

FIG. 6 schematically illustrates the layout of the second embodiment of the invention. In this embodiment, as in the first, an excimer laser 26 provides the radiation. The illumination system 46 is very similar to that of the first embodiment of the invention and consists of beam-conditioning optics 43, a focusing lens 44, an energy-recycling homogenizer 30, and a condenser lens 35. In the second embodiment, however, the condenser lens forms a focal spot array (FSA) 47 by a process to be described below. Each beamlet, e.g. 38, exiting the FSA is incident on a single mirror element, e.g. 39, as in the first embodiment. In the second embodiment, each mirror element, e.g. 39, of the micro-mirror array steers the beam through a projection lens 48 to hit a particular target via site, e.g. 49, in the addressable area 50 on the substrate panel 2 mounted on a stage 58. Individual subsystems of the two preferred embodiments of the invention will be described in more detail below.

For both embodiments of the invention, the radiation source is an excimer laser 26. A XeCl excimer laser operating at a wavelength of 308 nm is preferred. This type of laser typically fires pulses with an average pulsewidth of 30 ns at repetition rates up to several hundred Hz giving average powers up to 200 W. This power output is ten to a hundred times greater than what can be produced by the frequency-multiplied solid state lasers used in some via generation systems. The output beam of such an excimer laser is usually very non-uniform in intensity, highly divergent, and rectangular in cross-section. For this reason the output beam must be uniformized, conditioned, and shaped before it can be used in a controlled manner. The illumination system, which will be described below, accomplishes this.

The illumination consists of several optical components which uniformize, shape, and relay the excimer laser beam: the beam-conditioning optics 43, the beam-steering mirror (s) 28, the energy-recycling homogenizer 30, and the condenser lens 35. The beam-conditioning optics 43 consist of several cylindrical and spherical lenses which equalize the horizontal and vertical divergences of the beam and expand or compress the beam size along one or both directions to make the rectangular output beam nearly square in cross-section. This conditioned beam then is steered by the beam-steering mirror(s) 28 and focused into the homogenizer 30 by the focusing lens 44. The focal spot is produced inside the homogenizer 30 just beyond the aperture 32 of the homogenizer entrance mirror 29 whose inner surface 33 is reflective. The radiation from this focal spot fills the internally reflecting surfaces of the homogenizer 30. The beam undergoes multiple reflections, e.g., for ray 31, inside the long light tunnel which serve to uniformize the beam intensity distribution by averaging non-uniformities in the source beam. The homogenizer 30 preserves the numerical aperture (NA) of the beam produced by the focusing lens 44 and produces a highly uniform output radiation distribution at its output end 34. The homogenizer 30 can be constructed with a variety of cross-sectional shapes and the output end 34 can be designed to have almost any polygonal shape. The preferred cross-section is hexagonal. The mirror 29 at the homogenizer's entrance face allows rays that are retroreflected further down the optical train to be reflected back into the illumination train to, in effect, recycle the retroreflected radiation energy. A more detailed description of the principles behind the operation of the homogenizer can be found in U.S. Pat. No. 5,059,013, and details of its construction are given in U.S. Pat. No. 5,828,505. Finally, the condenser lens 35 relays the beam from the homogenizer to the beamlet formation and steering system in one of two ways depending on the embodiment of the invention: for the first embodiment of the invention, the condenser lens roughly collimates the output beam from the homogenizer and directs the collimated beam 36 to the fly's-eye lens array; for the second embodiment of the invention, the focal point at the entrance face of the homogenizer 30 is imaged by the condenser to produce a focal spot array (FSA) as will be described in more detail below.

Figure 3:
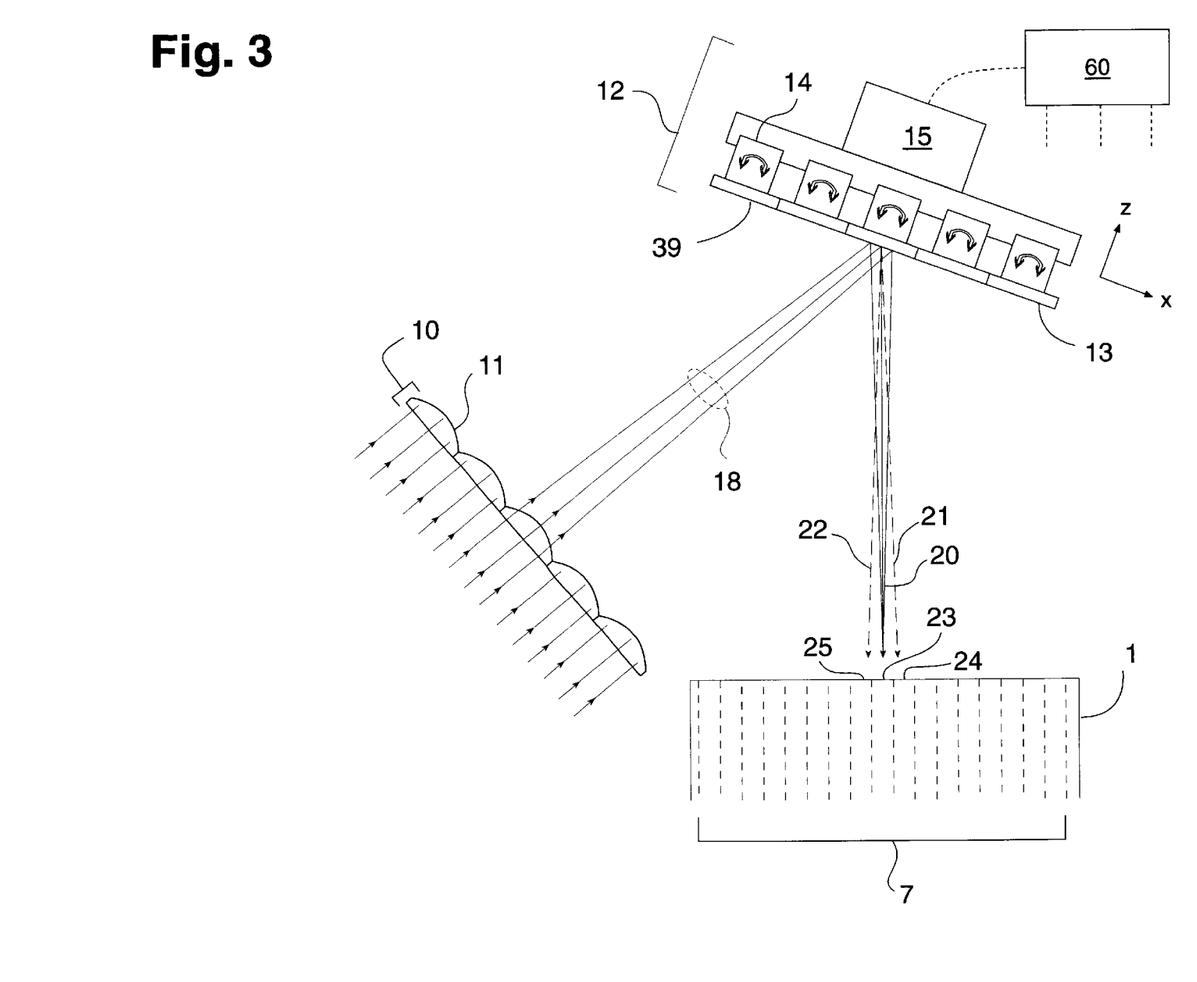
FIG. 3 is a schematic side view of the beamlet formation and steering system, including a 2-D fly's-eye microlens array and a controllable 2-D tip-tilt mirror array. The figure illustrates how the individual mirror elements can tilt to direct a beamlet to an individual fiber in the bundle.
Figure 4A:
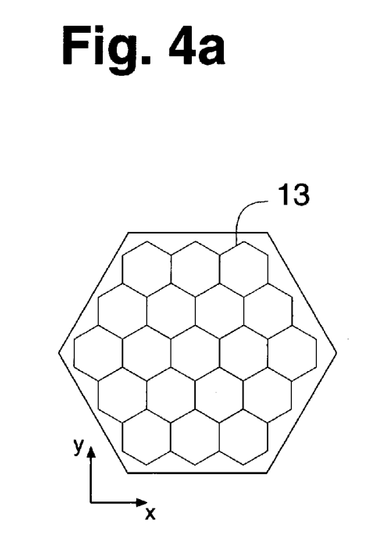
FIG. 4a is a plan view of the controllable tip-tilt mirror array showing a close packed hexagonal arrangement of the hexagonally shaped mirror elements.
Figure 4B:
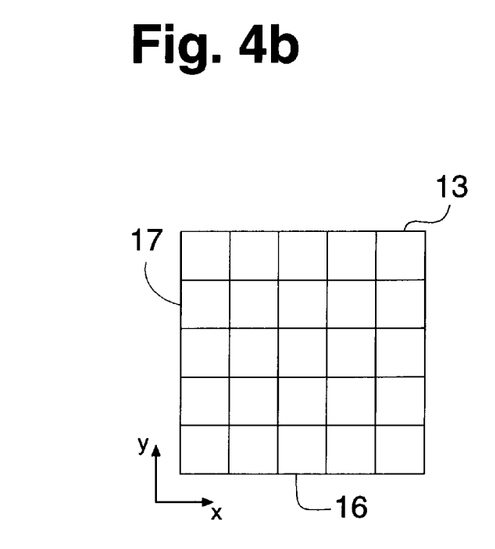
FIG. 4b presents an alternative mirror array arrangement with a 2-D rectangular geometry.
Figure 4C:
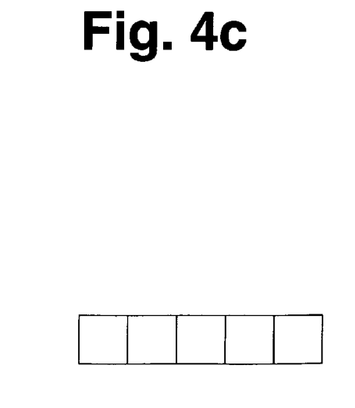
FIG. 4c presents an alternative mirror array arrangement with a 1-D linear geometry.
Figure 5:
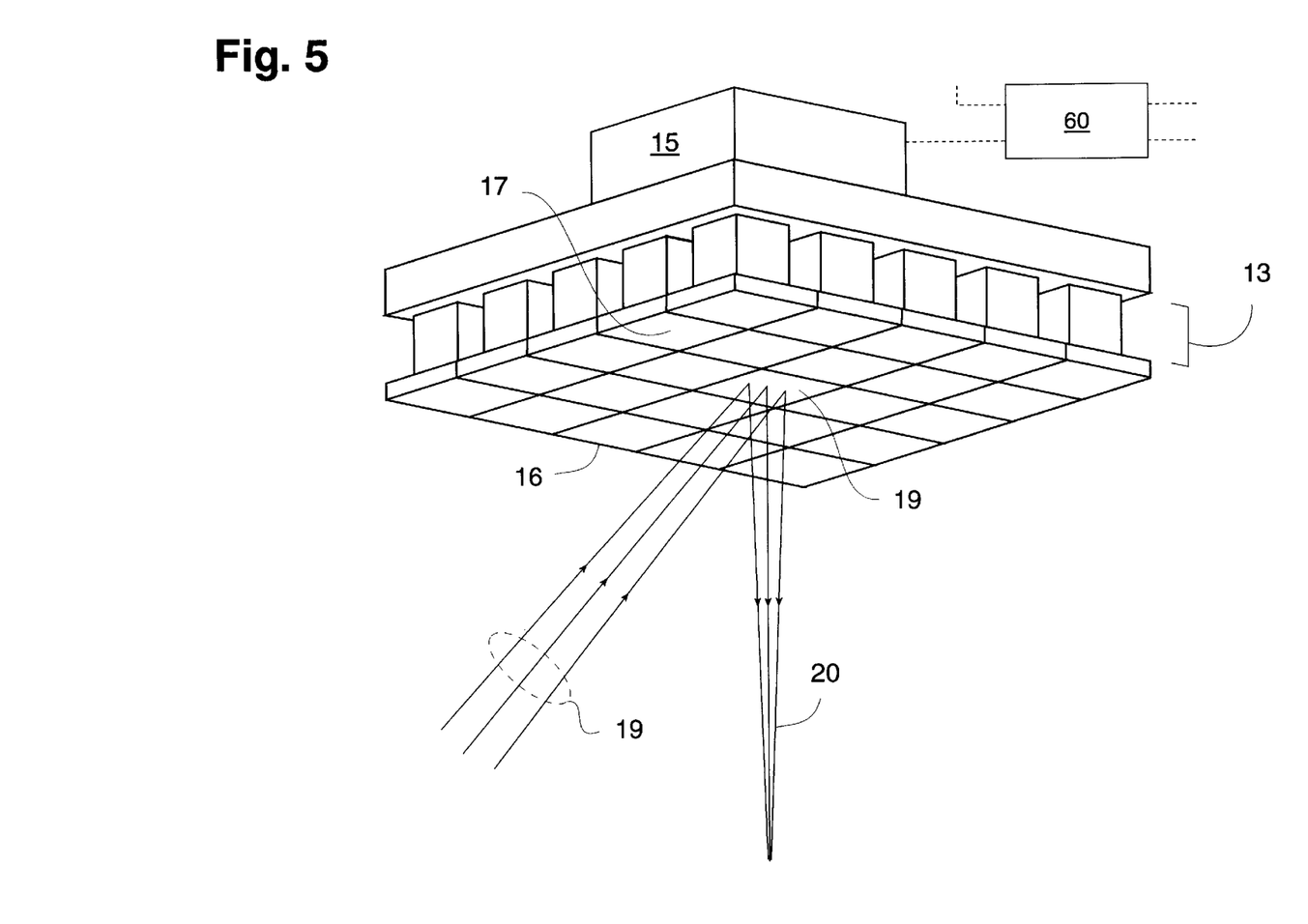
FIG. 5 is a schematic perspective view of the rectangular mirror array showing how an individual mirror element reflects a beamlet in the desired direction.

In the first embodiment of the invention, the beamlet formation and steering system consists of a fly's-eye lenslet array 10 and a tip-tilt micro-mirror array 12 which is computer-controlled by signals from the central control unit 60. The conditioned and collimated laser beam 36 is directed by a fold mirror 37 towards the fly's-eye lenslet array 10 which divides the beam into an array of converging beamlets, e.g. 18 and 38. The lenslet array can be in several forms: the lenslets, e.g., 11, can be arranged in a hexagonal close-packed (HCP) array as illustrated in FIG. 4a, or in a rectangular grid as shown in FIG. 4b, or in a staggered array, or any other two-dimensional arrangement. Each of the beamlets produced by the lenslets impinges on a single mirror element, e.g. 39 or 41, of the tip-tilt micro-mirror array 12. Because of the one-to-one correspondence between a lenslet/beamlet and a micro-mirror element, the mirror elements, e.g. 13, in the micro-mirror array 12 need to be arranged in configurations similar to those of the lenslet array 10, e.g. the HCP array shown in FIG. 4a, or the rectangular array shown in FIG. 4b, or the linear array shown in FIG. 4c. The tip and tilt of each mirror element in the array, e.g. 39, 41 or 13, is controlled by appropriate actuators, e.g. 14, providing small rotations of the mirror element about two axes. An appropriate actuator 14 may be a system of three piezo-ceramic cylinders working in concert to produce the required tip-tilt motion of the mirror element 13. These actuators receive control signals from a computer-controlled servo system 15, which receives commands from the central control unit 60. FIG. 3 illustrates how this arrangement works to allow computer-controlled steering of each beamlet 18 into one of several output directions 20–22. Each mirror element, e.g. 41, is also capable of retroreflecting unneeded beamlets back into the illumination system for energy recycling as shown by ray 42 in FIG. 1. In this way, a large number of beamlets can be directed into a much larger number of output directions or channels (including retroreflection for energy recycling) by high-speed computer control.

Figure 2:
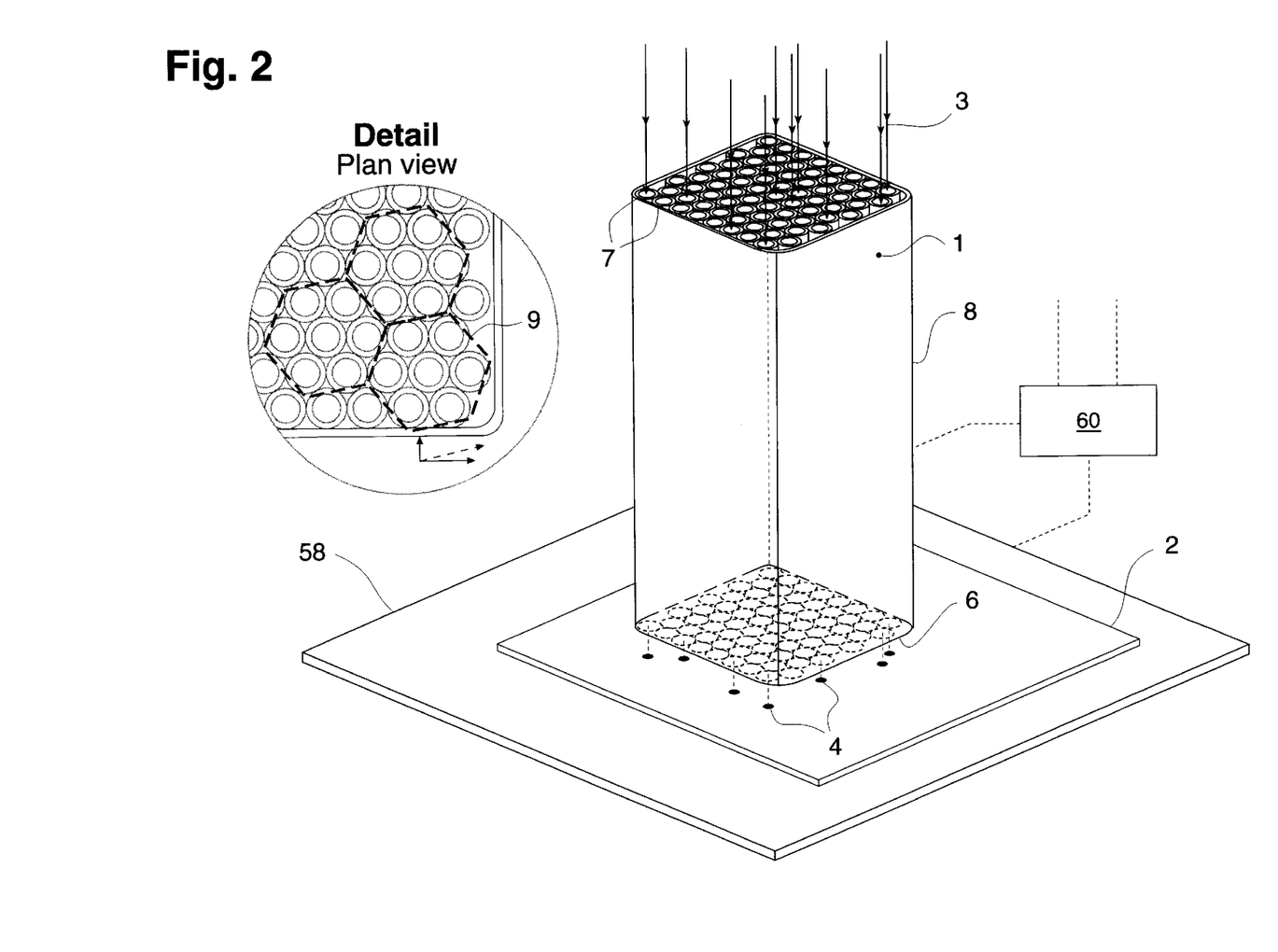
FIG. 2 is a schematic representation of the optical fiber bundle with the substrate positioned near its output. A plan view detail illustrates the concept of hexagonal grouping of the optical fibers and the optimization of illumination by this grouping.
Figure 7:
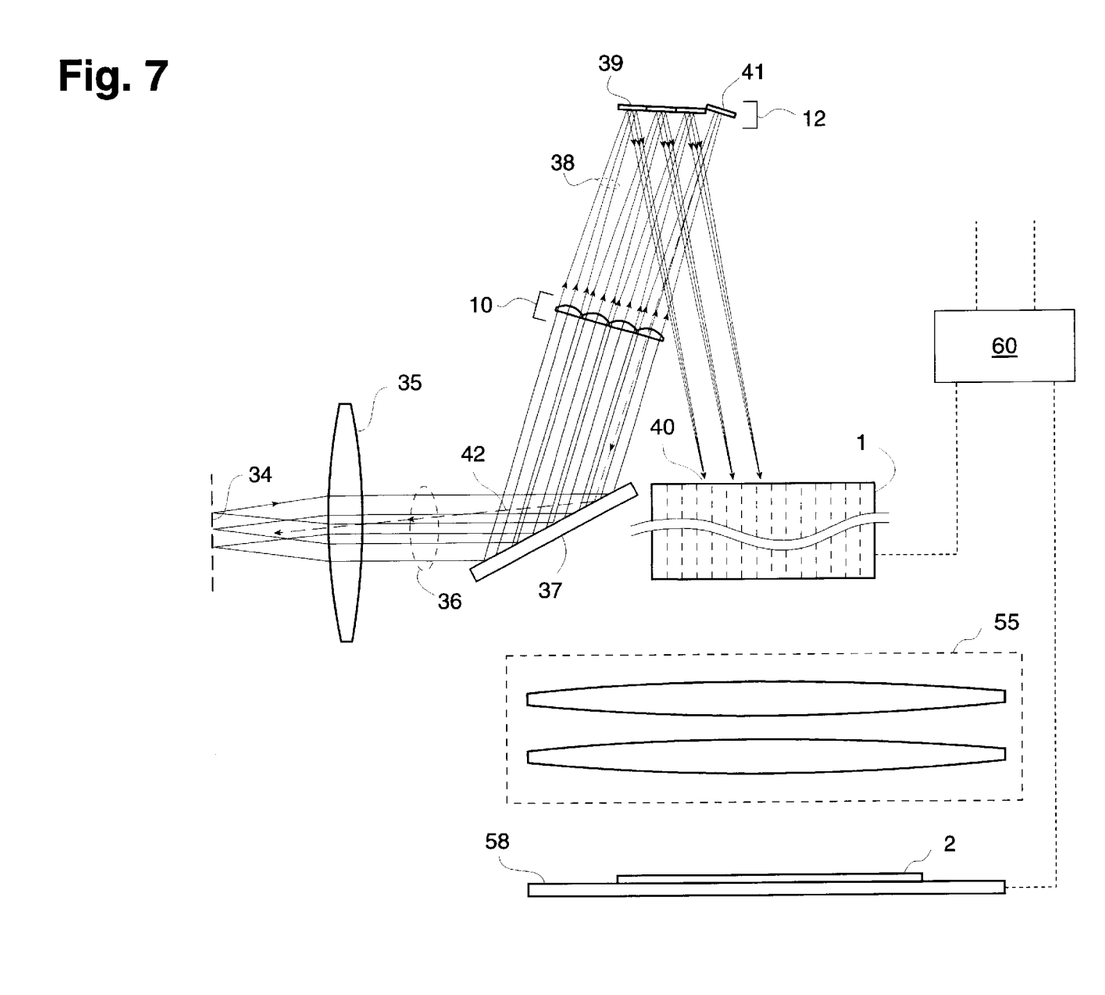
FIG. 7 shows a variation of the first embodiment of the invention with the inclusion of a projection lens between the exit face of the fiber bundle and the substrate.

For the first embodiment of the invention, the output channels for the beamlets, 23–25, are the individual fibers 7 of the fiber bundle 1 which form the beamlet-relay system. As shown in FIG. 2, the fiber bundle 1 receives the incident beamlets 3 and is positioned over the substrate 2. These fibers would typically be UV-grade fused silica with 5 to 10 micron diameter cores and several micron thick cladding. They are potted in a casing 8. In fiber bundle 1 the fibers form an array with a pitch of 6 to 30 microns depending on the fiber type. The beamlets emerging from the exit face 6 of this array of fibers represents a grid of possible via sites 4 which are selectable by the beamlet steering system 12. Each selected fiber channels the incident beamlet 18 to the substrate 2 where a via is generated by the process of photo-ablation. The beamlets can either propagate from the output of the fibers to the via sites across a small air-gap between the fiber bundle 1 and the substrate 2, or be imaged by a projection lens 55 inserted between the fiber bundle 1 and the substrate as shown in FIG. 7. Many forms for the fiber array are possible, and the fibers can be grouped into small groups, e.g. 9, each fiber in a group being addressable by a single beamlet. Examples of possible fiber arrays include: a HCP 7-fiber group 9 arranged 6-around-1 as illustrated in FIG. 2; larger HCP fiber groups; rectangular or square arrays; line arrays where each mirror addresses a segment of the line; and other arrays tailored to the types of via patterns that need to be generated. Vias can be generated at any point on the grid produced by the fiber array. If vias need to be placed at off-grid points, the high-precision X-Y stage 58 moves the substrate and/or the fiber bundle exit face is moved to place the vias at any point desired on the substrate.

The beamlet formation and steering system for the second embodiment of the invention differs from that of the first embodiment in its use of a focal spot array (FSA) 47. The illumination system 46 in this embodiment is largely the same as what was described above: beam-conditioning optics 43 and steering mirrors 28 deliver the beam to the focusing lens 44 which focuses the beam into the entrance aperture 32 of the energy recycling homogenizer 30. The point source produced at the entrance aperture 32 is imaged by the condenser lens 35 to form a FSA 47 in a plane further down the optical train. In the FSA the image of the point source in the entrance aperture 32 appears surrounded by an array of spots which are the reflected images of the original focus. The number and spacing of the focal spots in the FSA can be specified by the design of the energy-recycling homogenizer 30. The length and transverse size of the homogenizer, coupled with the NA of the beam leaving the source focus, determine how many reflections different parts of the beam will undergo in the homogenizer, and, thus, the number and spacing of the spots in the FSA 47. In general, the intensity of the focal spots in the FSA will not be identical, but an apodization filter 51 placed just after the FSA can be used to equalize the intensities of the beamlets leaving the FSA if required. In addition, an aperture array 56 can be used in the plane of the apodization filter to clean up the edges of the beamlets. This arrangement provides a very efficient way to break up the source beam into a large array of individual beamlets. Each beamlet from each spot in the FSA impinges on a single mirror element of a tip-tilt micro-mirror array 12 which can either steer the beamlet or retroreflect it into the illumination system for energy recycling. The computer controlled mirror array 12 is essentially the same subsystem described for the first embodiment of the invention above.

The second embodiment of the invention also differs from the first in the way the beamlets are relayed to the substrate for via generation. In the second embodiment, a projection lens 48 between the mirror array and the substrate images the spots in the FSA to various via sites 49 in the addressable area 50 on the substrate 2. The exact position of each via site is determined by the tip-tilt setting of the mirror element which steers that beamlet. In this arrangement, beamlets can be steered to any point in the field-of-view of the projection lens, effectively allowing an infinite number of output channels for the beamlet steering and relay system. This also allows for greater capabilities in the positioning of beamlets on the substrate. For example, multiple beamlets can be directed to the same site on the substrate 2 to enable faster via generation. Or, several beamlets can be steered to nearly overlap at a via site to enable faster generation of larger diameter vias. A dithering capability can be added to either the projection lens 48, the substrate stage 2, or the tip-tilt mirrors 12 to blend the edges formed by the overlap of multiple beamlets. This beamlet steering configuration has the added advantage it allows the beamlets to be directed into essentially an infinite number of output channels instead of one channel out of several possible. But while this beamlet steering configuration is more flexible, it requires a much higher level of beamlet-steering control, i.e. more complex servo-controls.

For either embodiment of the invention, the central control system 60 is critical for forming the proper via patterns in the substrate. The control system coordinates the actions of all the subsystems to produce the required array of vias: it controls the pulse energy, repetition rate, and number of pulses fired by the excimer laser 26; it controls the beamlet-steering mirror array 12 to direct the beamlets to the correct locations on the substrate 2; and it controls the movements of the substrate stage 58 and/or the fiber bundle 1 to bring the appropriate areas of the substrate 2 into the addressable area 50 under the projection lens 55. The central control system 60 reads the via pattern information from standard CAD-type files. These files contain information on the via locations, sizes, and depths. Using this information, the central control system calculates the optimum way to generate the via pattern. The optimization parameters include possible substrate stage paths to cover all via sites, choice of beamlet-steering mirror angles to address the required via sites, and number of laser pulses to be delivered to each via site. The optimal stage paths and beamlet-steering angles are calculated to minimize time, while the optimal number of pulses relies on a number of different factors. The most important of these factors are the via density in the addressable area 50, the ablation etch rate of the material being processed, the laser pulse energy and repetition rate, and the energy multiplication factor from the energy-recycling illumination system. The energy multiplication factor varies depending on the number of vias in the addressable area—when more beamlets are available than via sites to pattern, unused beamlets can be retroreflected and, thus, recycled, effectively increasing the energy available for the photoablation process in the remaining via sites. Since there are so many parameters involved in the via generation process, flexible computer control allows many paths for optimizing the process for different substrate materials and via patterns.

Either of the two embodiments of the invention provides a very flexible via generation system with the following features: high-throughput via generation; the ability to generate any desired via pattern from CAD-type files; flexibility to optimize the process for various materials and via patterns; full utilization of the available laser source power (and since excimer lasers have very high average output powers, this offers large performance benefits over the more commonly used frequency-multiplied solid state lasers); and the ability to recycle the laser energy when via density is low. Each embodiment of the invention has its relative strengths. The first embodiment uses a simpler control method to generate the via patterns. It also allows the fiber bundle geometry to be chosen to specifically match or optimize a particular via pattern (for example a regular square array). Finally, the first embodiment allows the laser source to be located remotely from the via generation system since the radiation can be delivered very efficiently through the fiber bundle. This allows the system to be very compact and have a small footprint. The second embodiment of the invention, on the other hand, provides more flexibility in the placement of vias and in energy utilization, since multiple beamlets can be overlapped at a single via site. This also allows the system to more efficiently generate larger vias or features by partially overlapping beamlets.

Method of Operation

The preferred method of forming vias comprises the following steps:

Step 1) activating a radiation source to produce a beam of pulses;

Step 2) providing such beam of pulses to a beam conditioning subsystem capable of accepting said beam and delivering a conditioned beam of radiation pulses having defined characteristics;

Step 3) providing a set of conditioned beamlets of radiation pulses;

Step 4) positioning a spatial light modulator array so that said set of conditioned radiation pulse beamlets are incident upon the spatial light modulator array in a defined pattern, transmitting selected beamlets in a defined subpattern, and reflecting unselected beamlets back into the beam conditioning subsystem for re-reflection so as to be re-incident upon the controllable spatial light modulator array;

Step 5) presenting a substrate;

Step 6) projecting said selected beamlet subpattern from said spatial light modulator array onto said substrate; and Step 7) controlling the pulses from the radiation source, controlling the beam conditioning, and controlling the substrate presentation for delivering pulses of defined characteristics upon the substrate for via formation.

TABLE 1

System Design Example and Estimated Throughput for High-Speed Maskless Via Generation System

| Material to be ablated | Polyimide |
|---|---|
| Thickness to be removed | 12.5 microns |
| Ablation etch rate | 0.6 microns per Joule/sq. cm |
| Dose (fluence) | 2 Joule/sq. cm |
| Number of steering mirrors | 61 |
| Number of fibers | 427 |
| Number of selected fibers per bundle | 14 (approx. 1 out of every 30) |
| Energy recycling multiple | 4 |
| Laser repetition rate | 1000 Hz |
| Point-to-point move time | 11 msec |
| Via density | 200,000 vias/sq. ft. |
| Via generation throughput | 1000 vias/sec or 18 sq. ft./hr |

System Example and Throughput Estimate

In this section we present an example of a system design and throughput analysis which demonstrates the attractive performance of the new via generation system. To arrive at the throughput estimates, we use realistic system parameters and representative manufacturing requirements. The key parameters which influence the throughput are: (a) material properties such as ablation threshold, intrinsic etch rate, and thickness; and (b) the density of the vias and their distribution across the substrate. The system throughput will therefore also show dependence on the design of the interconnect structure of the electronic module. The results of the throughput analysis described below are for the representative case of via generation in 12.5 $\mu$m thick polyimide layers. Table 1 shows the throughput figures we have estimated along with the key system design specifications that were used in the calculation.

The system throughput determination is based on the drilling time required for a group of vias (i.e., the vias addressed by one position of the fiber bundle), the time required to move between drilling regions (the region-to-region move time), and the total number of via generation regions, and is calculated by the following equation:

$$T=(D+M)*N \quad (1)$$

where T is the total drilling time, D is the drilling time for vias in one region, M is the region-to-region move time, and N is the number of drilling regions. The via region drilling time is a function of the thickness of the material, the fluence delivered to the substrate, and the etch rate of the substrate material. Note that neither the via hole size nor the number of vias in the region have a major effect on the drilling time for this system concept. Rather, they affect the required laser power and fiber bundle design. In this case, a 15 W excimer laser was used to generate holes up to 100 $\mu$m in diameter, and a fluence of 2 J per sq. cm was easily obtained. If higher fluences are required, such as for the ablation of metals and other inorganics, they can easily be generated with a higher-power laser (excimer lasers with up to 200 W of average power are commercially available). Finally, the recycling multiple of the energy recycling homogenizer has an impact on the throughput. Multiples of up to 5× have previously been shown to be possible; we have conservatively chosen a multiple of 4× with the knowledge that the eventual number will vary according to the number of vias being ablated simultaneously at any particular region.

The calculation of the region-to-region move time depends on the average distance moved and the acceleration of the positioning stage(s). We have surveyed the specifications of several commercial high-speed scanning stages to determine the acceleration. The distance between via generation regions is expected to vary according to the design of the interconnect structure, the overall density of vias, and the distribution of the vias across the substrate. Although the move time will decrease with shorter distances between regions, the total number of regions will then increase, thereby adversely affecting the throughput. Accordingly, the more uniform the distribution of the vias, the larger the number of via generation regions and, therefore, the lower the net drilling throughput (that is, the system will lose some of its advantage as a highly parallel via drilling machine). The system throughput goes up dramatically with the introduction of local areas of high via density because the number of via generation regions decreases and the benefits of multiple-up via generation can be realized. Such interconnect designs are, in fact, quite common in IC packaging applications. It is therefore reasonable to assume that the average number of vias to be generated per region (the same as the number of selected fibers) ranges from 10 to 20. Using a number in this range and a via density in the range of 100,000 to 300,000 per sq. ft. (which is representative for the high-performance multichip electronic modules), the move distance, move time and number of regions are calculated. Finally, the system throughput is determined according to the via density divided by the total drilling time.

The above throughput projection illustrates the fundamental advantages of the system disclosed in this invention, namely, its ability to combine the benefits of using a high-power excimer laser source, utilizing the source power fully, highly parallel via generation, and programmability in via configuration and site selection.

While the invention has been shown and described with respect to the above preferred embodiments for via generation, it will be obvious to those skilled in the art to use the apparatus and technique for more generalized material processing or treatment by use of controlled photo-ablation or high-fluence photo-treatment, making alterations within the spirit and scope of the invention as defined in the following claims.

What is claimed is:

1. A system for processing by directed radiation a workpiece at a processing station, comprising:
   a) a radiation source (26) to produce a radiation beam (27);
   b) beam conditioning means (28–35; 43–44) to process, transform, recycle, and deliver a conditioned beam (36) of radiation having defined characteristics;
   c) beam dividing means (10) to divide said conditioned beam of radiation into a multiplicity of focused beamlets (e.g., 38);
   d) spatial light modulator means (12) for directing said multiplicity of focused beamlets to specific sites on the workpiece (2) at the processing station; and
   e) a control means (60) that directs the activities of said radiation source, said beam conditioning means (28–35; 43–44), said beam dividing means (10) and said spatial light modulator means (12), with respect to the workpiece, wherein said control means command said spatial light modulator means to re-direct unused ones of said multiplicity of focused beamlets to said beam condition means (2).

2. A system for processing a workpiece (2) by directed radiation, according to claim 1, wherein said radiation source (26) is an ultraviolet laser.

3. A system for processing a workpiece (2) by directed radiation, according to claim 1, wherein said beam conditioning means (28–35; 43–44) includes a homogenizing device (30) and produces a uniform beam (36) of polygonal cross-section.

4. A system for processing a workpiece by directed radiation, according to claim 1, wherein said spatial light modulator means (12) is an array of spatial light modulating elements arranged in a hexagonal pattern.

5. A system for processing a workpiece by directed radiation, according to claim 1, wherein said spatial light modulator means (12) is an array of spatial light modulating elements in a rectangular pattern.

6. A system for processing a workpiece by directed radiation, according to claim 1, wherein said spatial light modulator means (12) is an array of spatial light modulating elements in a linear pattern.

7. A system for processing a workpiece by directed radiation, according to claim 1, wherein said beam dividing means (10) is an array of lenslets such as a fly's-eye lens.

8. A system for processing a workpiece by directed radiation, according to claim 1, wherein spatial light modulator means (12) is an array of micro-mirrors, each of which is individually tiltable under command from said control means (60).

9. A system for processing a workpiece by directed radiation, according to claim 1, wherein said spatial light modulator means (12) is an array of transmissive optical elements where transmission of each element is individually selectable under command from said control means (60).

10. A system for processing a workpiece by directed radiation, according to claim 1, further comprising:
    g) imaging means (55) to image the focused beamlets at specific sites on the workpiece.

11. A system for processing a workpiece by directed radiation, according to claim 1, further comprising:
    f) channeling means for carrying the focused beamlets to specific sites (4) on the workpiece (2).

12. A system for processing a workpiece by directed radiation, according to claim 11, in which:
    f) said channeling means comprises a bundle of optical fibers (1) for carrying the focused beamlets to specific sites on the workpiece (2).

13. A system for processing a workpiece by directed radiation, according to claim 11, in which:
    f) said channeling means comprises a set of integrated optical waveguides for carrying the focused beamlets to specific sites (4) on the workpiece (2).

14. A system for processing by directed radiation a workpiece at a processing station, comprising:
    a) a radiation source (26) to produce a radiation beam;
    b) beam conditioning means (28–35; 43–44), having radiation energy recycling capability, to deliver a conditioned beam (36) of radiation having defined characteristics including energy recycling by an energy recycling homogenizer (30);
    c) beam dividing means (10) to divide said conditioned beam of radiation into a multiplicity of focused beamlets;
    d) spatial light modulator means (12) for directing said multiplicity of focused beamlets (38) to specific sites on the workpiece (2) at the processing station; and
    e) a control means (60) that commands said spatial light modulator means to re-direct unused ones of said multiplicity of focused beamlets to said beam conditioning means (28–35; 43–44), for radiation energy recycling, and for directing the activities of said radiation source, said beam conditioning means and said beam dividing means, with respect to the workpiece (2).

15. A system for processing a workpiece by directed radiation, according to claim 14, wherein said control means (60) controls the aggregate energy delivered in a beamlet by enabling delivery of a defined number of pulses from said radiation source (26).

16. A system for processing a workpiece by directed radiation, according to claim 14, wherein said control means (60) controls the aggregate energy delivered in a beamlet by controlling the duration of the on-time of said energy source (26).

17. A system for processing a workpiece by directed radiation, according to claim 14, wherein said control means (60) control of aggregate energy is by command to said radiation source (26) to deliver defined energy per unit time for a defined time duration.

18. A system for processing a workpiece by directed radiation, according to claim 14, wherein said control means (60) control of the aggregate energy delivered in beamlets considers information derived by feedback monitoring of the processing status of the workpiece.

19. A system for processing a workpiece by directed radiation, according to claim 14, wherein said control means (60) control of the aggregate energy delivered in beamlets considers the effect of a mask in the optical path to the workpiece.

20. A system for processing a workpiece by directed radiation, according to claim 14, wherein the processing station includes a precision positioning device (58) and wherein said control means (60) provides command signals to said precision positioning device to align the workpiece for site selection.

21. A system for processing a workpiece by directed radiation, according to claim 14, wherein the system includes a precision positioning device to move said channeling means (1) and wherein said control means (60) provides command signals to said precision positioning device to align the channeling means for site selection.

22. A system for processing a workpiece by directed radiation, according to claim 14, wherein the processing station includes a precision positioning device (58) and wherein said command signals dither the workpiece for an unusual site selection.

23. A system for processing a workpiece by directed radiation, according to claim 14, wherein said control means (60) performs the following functions:
   (e1) receives information about configuration of sites (e.g., 4) to be processed;
   (e2) produces command signals to appropriate elements (e.g., 39, 41) in said spatial light modulator means (12) to direct un-needed beamlets (e.g., 42) back to said radiation energy recycling means (30) within said beam conditioning means (29–35; 43–44); and
   (e3) determines from said information (e1) and from said command signals (e2) the aggregate radiation energy to be delivered in the beamlets to the selected sites to be processed.

24. A system for processing a workpiece by directed radiation, according to claim 14, wherein said control means (60) calculates the impending development of an out-of-specification situation at a via site and alters the aggregate amount of energy to be delivered to that via site accordingly.

25. A system for processing a workpiece by directed radiation, according to claim 14, wherein said command signals cause the workpiece (2) to be moved from a selected site prior to completion of processing for said site, and to return the workpiece (2) to the site after a time duration effective to eliminate dimensional distortion at the site as a result of processing.

26. A system for processing a workpiece by directed radiation, according to claim 1, wherein said beam dividing means is a focal spot array (47) produced by said beam conditioning means (28–35; 43–44).

27. A system for processing a workpiece by directed radiation, according to claim 1, wherein an apodization filter (51) and an apertured mask (56) are located optically downstream from said beam dividing means (47).

28. A method of ablating vias, comprising the following steps:

Step 1) activating a radiation source to produce a beam of pulses;

Step 2) providing such beam of pulses to a beam conditioning subsystem capable of accepting said beam and delivering a conditioned beam of radiation pulses having defined characteristics;

Step 3) providing a set of conditioned radiation pulse beamlets;

Step 4) positioning a spatial light modulator means so that said set of conditioned radiation pulse beamlets are incident upon the spatial light modulator means in a defined pattern, transmitting selected beamlets in a defined subpattern, and reflecting unselected beamlets back into the beam conditioning subsystem for re-reflection so as to be re-incident upon the controllable spatial light modulator array;

Step 5) presenting a substrate;

Step 6) projecting said selected beamlet subpattern from said spatial light modulator means onto said substrate; and Step 7) controlling the pulses from the radiation source, controlling the beam conditioning, and controlling the substrate presentation for delivering pulses of defined characteristics upon the substrate for via formation.

* * * * *

UNITED STATES PATENT AND TRADEMARK OFFICE
CERTIFICATE OF CORRECTION

PATENT NO. : 6,515,257 B1
DATED : February 4, 2003
INVENTOR(S) : Kanti Jain and Nestor I. Farmiga It is certified that error appears in the above-identified patent and that said Letters Patent is hereby corrected as shown below:

<u>Column 1,</u>
The paragraph beginning on line 12, is corrected to:

-- This invention was made with Government support under contract DASG60-00-m-0084 awarded by U.S. Army Space and Missile Defense Command. The Government has certain rights in the invention. --

Signed and Sealed this

Sixth Day of May, 2003

JAMES E. ROGAN
*Director of the United States Patent and Trademark Office*